(12) United States Patent
Rho

(10) Patent No.: US 7,728,643 B2
(45) Date of Patent: Jun. 1, 2010

(54) DELAY CIRCUIT AND SEMICONDUCTOR MEMORY DEVICE INCLUDING THE SAME

(75) Inventor: Kwang-Myoung Rho, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/327,520

(22) Filed: Dec. 3, 2008

(65) Prior Publication Data

US 2009/0256612 A1 Oct. 15, 2009

(30) Foreign Application Priority Data

Apr. 14, 2008 (KR) ...................... 10-2008-0034011

(51) Int. Cl.
H03H 11/26 (2006.01)
(52) U.S. Cl. ...................... 327/276; 327/263; 327/264; 327/278; 327/285; 327/538
(58) Field of Classification Search ................ 327/264, 327/276–278, 281, 284, 285, 288, 535, 537–541
See application file for complete search history.

(56) References Cited

U.S. PATENT DOCUMENTS

| | | | | |
|---|---|---|---|---|
| 4,853,654 A | * | 8/1989 | Sakurai | ...................... 331/57 |
| 5,808,505 A | * | 9/1998 | Tsukada | ...................... 327/536 |
| 6,262,616 B1 | * | 7/2001 | Srinivasan et al. | ........... 327/264 |
| 6,529,058 B2 | * | 3/2003 | Gupta | ......................... 327/276 |
| 6,836,165 B2 | | 12/2004 | Goto et al. | |
| 6,982,923 B2 | | 1/2006 | Ootsuki et al. | |
| 2005/0168259 A1 | | 8/2005 | Yamawaki | |
| 2005/0254307 A1 | | 11/2005 | Dietrich et al. | |

FOREIGN PATENT DOCUMENTS

| | | |
|---|---|---|
| JP | 02-159815 | 6/1990 |
| JP | 2003-273712 | 9/2003 |
| JP | 2005-348296 | 12/2005 |
| KR | 1020020055922 A | 7/2002 |
| KR | 1020070044188 A | 4/2007 |
| KR | 1020080029577 A | 4/2008 |

OTHER PUBLICATIONS

Notice of Allowance issued from Korean Intellectual Property Office on Feb. 5, 2010.

* cited by examiner

Primary Examiner—An T Luu
(74) Attorney, Agent, or Firm—IP & T Law Firm PLC

(57) ABSTRACT

A delay circuit that includes a logic gate through which an input signal passes, a capacitor configured to be charged and discharged at an output terminal of the logic gate and delaying the input signal, and a mirroring unit configured to constantly maintain current output by the logic gate by mirroring current output by a constant current source.

8 Claims, 6 Drawing Sheets

DELAY CIRCUIT AND SEMICONDUCTOR MEMORY DEVICE INCLUDING THE SAME

CROSS-REFERENCE TO RELATED APPLICATION

The present invention claims priority of Korean patent application number 2008-0034011, filed on Apr. 14, 2008, which is incorporated by reference in its entirety.

BACKGROUND OF THE INVENTION

The present invention relates to a technology for preventing a delay value of a delay circuit whose function is to adjust a sensing margin of a bit line sense amp (BLSA) in a semiconductor memory device according to variations of process, voltage, and temperature (PVT) conditions in a chip. The delay circuit of the invention can be applied to a variety of integrated circuits (ICs) and semiconductor devices as well as semiconductor memory devices.

FIG. 1 is a circuit diagram illustrating a core region of a conventional semiconductor memory device, and FIG. 2 is a timing diagram illustrating the operation of a core region of a semiconductor device. The operation of a core region of a semiconductor memory device will be described with reference to FIGS. 1 and 2.

Once an active command is inputted, a word line is enabled (i.e., WL='high') and a transistor 101 is turned on. Therefore, data stored in a cell capacitor 102 may experience a charge-sharing phenomenon with respect to a bit line BL. Accordingly, nodes SA and SAB have a predetermined potential difference ΔV and, a bit line sense amp (BLSA) 103 is enabled after a predetermined delay (i.e., a sensing margin shown in FIG. 2) elapses. Thus, the nodes SA(BL) and SAB (BLB) have a predetermined potential difference between an effective ground VSS and a core operating voltage VCORE (it is assumed that data of 0 is stored in a cell capacitor).

Here, a time difference between when the word line WL is enabled and when the bit line sense amp (BLSA) 103 is enabled is called a sensing margin. If the time difference becomes shortened and the bit line sense amp (BLSA) 103 is enabled without adequate ΔV, data cannot be amplified properly. Consequently, a read failure occurs. Additionally, if the sensing margin exceeds a predetermined level, time for performing a read operation is increased such that tRCD (an important parameter of a memory device) also is increased.

Accordingly, the minimum sensing margin is secured under the PVT conditions in order for a memory device to operate stably and fast.

Signals BISH and BISL of FIG. 1 are signals for connecting and disconnecting the bit lines BL and BLB of a cell array with the bit lines SA and SAB of the bit line sense amp (BLSA) 103. A signal BLEQ is a bit line equalize signal for equalizing the bit lines BL and BLB during a precharge operation. The signal BLEQ is known to those skilled in the art. Thus, its detailed description will be omitted for conciseness.

FIG. 3 is a view illustrating a part for driving a word line and a sense amp in a conventional semiconductor memory device. As illustrated in FIG. 3, the conventional semiconductor memory device includes a word line driving circuit 310 for driving a word line WL, and a sense amp driving circuit 330, a delay circuit 320, and the sense amp driving circuit 330.

Once an active command is inputted, a word line enable signal WLE is enabled. In response to the word line enable signal WLE, the word line driving circuit 310 enables the word line WL.

The word line enable signal WLE is also inputted to the delay circuit 320, and the delay circuit 320 delays the word line enable signal WLE by its delay value and then outputs the delayed sense amp enable signal SAE. The sense amp driving circuit 330 enables the bit line sense amp (BLSA) 103 of FIG. 1 in response to the sense amp enable signal SAE. The bit line sense amp (BLSA) 103 is enabled by supplying driving voltages RTO and SB.

The word line enable signal WLE for determining the timing of enabling the word line WL is delayed by the delay circuit 320 and thus becomes the sense amp enable signal SAE for determining the timing of enabling the bit line sense amp (BLSA) 103. A time difference between enabling the word line WL and enabling the bit line sense amp (BLSA) 103 is the sensing margin of the bit line sense amp (BLSA) 103. As a result, a delay value of the delay circuit 320 becomes the sensing margin of the bit line sense amp (BLSA) 103.

Accordingly, the delay value of the delay circuit 320 corresponds to a very important factor during a particular operation of a core region of a memory device.

FIG. 4 is a circuit diagram illustrating a detail structure of the delay circuit 320 of FIG. 3. As illustrated in FIG. 4, the conventional delay circuit 320 delays a word line enable signal WLE through a plurality of capacitors 450 to 480 disposed between a plurality of inverters 410 and 440.

In relation to the above-mentioned operation, the inverters 410 to 440 invert an input signal (i.e., the word line enable signal WLE), and capacitors 450 to 480 are discharged and charged by a current flowing through transistors and resistors 411, 421, 431 and 441 in the inverters 410 and 440. The capacitors 450 to 480 are charged and discharged and also delay a time for transmitting the word line enable signal WLE. Accordingly, the word line enable signal WLE inputted to the delay circuit 320 is delayed by the inverters 410 to 440 and the capacitors 450 to 480, and then becomes a sense amp enable signal SAE. For reference, N+ active resistors are typically used as the resistors 411, 421, 431 and 441.

A delay time of the delay circuit 320 is dependent upon a time for charging and discharging the capacitors 450 to 480. Also, the time for charging and discharging the capacitors 450 to 480 is dependent upon a current flowing through the capacitors 450 to 480. The current flowing through the capacitors 450 to 480 may vary according to the resistance values of the transistors and the N+ active resistors 411, 421, 431 and 441, which constitute the inverters 410 to 440.

If a fabrication line of a semiconductor memory device is changed or its fabrication process is unstable, the resistance values of the transistors and the N+ active resistors 411, 421, 431 and 441, which constitute the inverters 410 to 440, are changed. Additionally, the changed resistance values affect a time for charging and discharging the capacitors 450 to 480. That is, a delay value of the delay circuit 320 having a conventional structure may vary greatly if the fabrication line is altered or its fabrication process is performed with no predictable pattern.

FIG. 5 is a view illustrating a change of a sensing margin according to a design of the delay circuit 320. A reference letter (A) represents a case in which a delay value of the delay circuit 320 is designed with a relatively small value, and a reference letter (B) represents a case in which a delay value of the delay circuit 320 is designed with a relatively large value. A reference letter FF represents a condition of when a delay value of the delay circuit 320 is the smallest because a fabrication process has a fast characteristic and a power supply voltage VDD is high. A reference letter NOM is represents a condition of when a delay of the delay circuit 320 is average because a fabrication process has an average characteristic and a power supply voltage VDD is average. A reference letter SS represents a condition of when a delay value of the delay circuit 320 is the largest because a process has a slow characteristic and a power supply voltage VDD is low.

First, let's examine the case (A). According to the conventional delay circuit 320, a delay change varies greatly according to changes of a fabrication process and a power supply voltage, as mentioned above. Therefore, the fabrication process is performed being biased toward a direction where the fabrication process is performed at a faster speed, and a delay value of the delay circuit 320 may become smaller than the minimum sensing margin SM_MIN in the case FF. If a delay value of the delay circuit 320 becomes smaller than the minimum sensing margin SM_MIN, the bit line sense amp (BLSA) 130 starts an amplification process when charge sharing is not completely finished. This causes a read failure.

To resolve the limitation of the case (A), let's examine the case (B) in which a delay value of the delay circuit 320 is designed with a large value.

In the case (B), because a delay value of the delay circuit 320 is designed with a large value, the delay circuit 320 has a larger delay value than the minimum sensing margin SM_MIN even under the condition FF. However, under the condition SS (i.e., the delay value of the delay circuit is largest), a delay value of the delay circuit 320 increases excessively such that an operating speed of a memory device can deteriorate.

That is, if a delay value of the delay circuit 320 is changed according to the conditions, the minimum sensing margin SM_MIN may not be obtained (i.e., the case A) or an operating speed of a memory device can deteriorate (i.e., the case B), leading to undesirable operation.

Therefore, a delay circuit capable of having a predetermined delay value constantly even when conditions are changed is desirable.

SUMMARY OF THE INVENTION

Embodiments of the invention are directed to providing a delay circuit capable of reliably maintaining a predetermined delay value even when conditions such a process, a voltage, and so forth are changed.

Embodiments of the invention are also directed to providing a delay circuit for maintaining a predetermined delay value in order to obtain the minimum sensing margin of a semiconductor memory device and maintain a higher operating speed of a memory device.

In accordance with an aspect of the invention, there is provided a delay circuit, which includes: a logic gate through which an input signal passes, a capacitor configured to be charged and discharged at an output terminal of the logic gate and delaying the input signal, and a mirroring unit configured to constantly maintain a current output by the logic gate by mirroring a current output by a constant current source.

In accordance with another aspect of the invention, there is provided a semiconductor memory device, which includes: a constant current source configured to generate a constant current, and a delay circuit, having at least one or more unit delay units, configured to output a sense amp enable signal by delaying a word line enable signal, wherein each unit delay unit includes a logic gate through which the word line input signal passes, a capacitor configured to be charged and discharged at an output terminal of the logic gate and delaying the word line input signal, and a mirroring unit configured to constantly maintain a current of the logic gate by mirroring the constant current of the constant current source.

DESCRIPTION OF SPECIFIC EMBODIMENTS

Hereinafter, a delay circuit and a semiconductor memory device including the same in accordance with the present invention will be described in detail with reference to the accompanying drawings.

Figure 6:
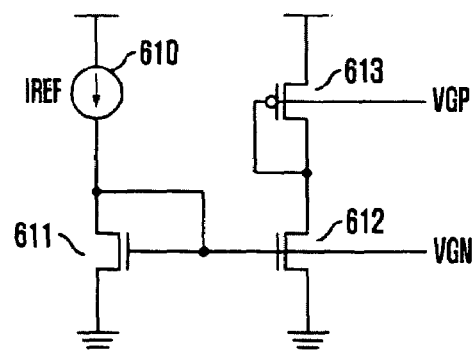
FIG. 6 is a circuit diagram of a delay circuit according to one embodiment of the present invention.
Figure 6:
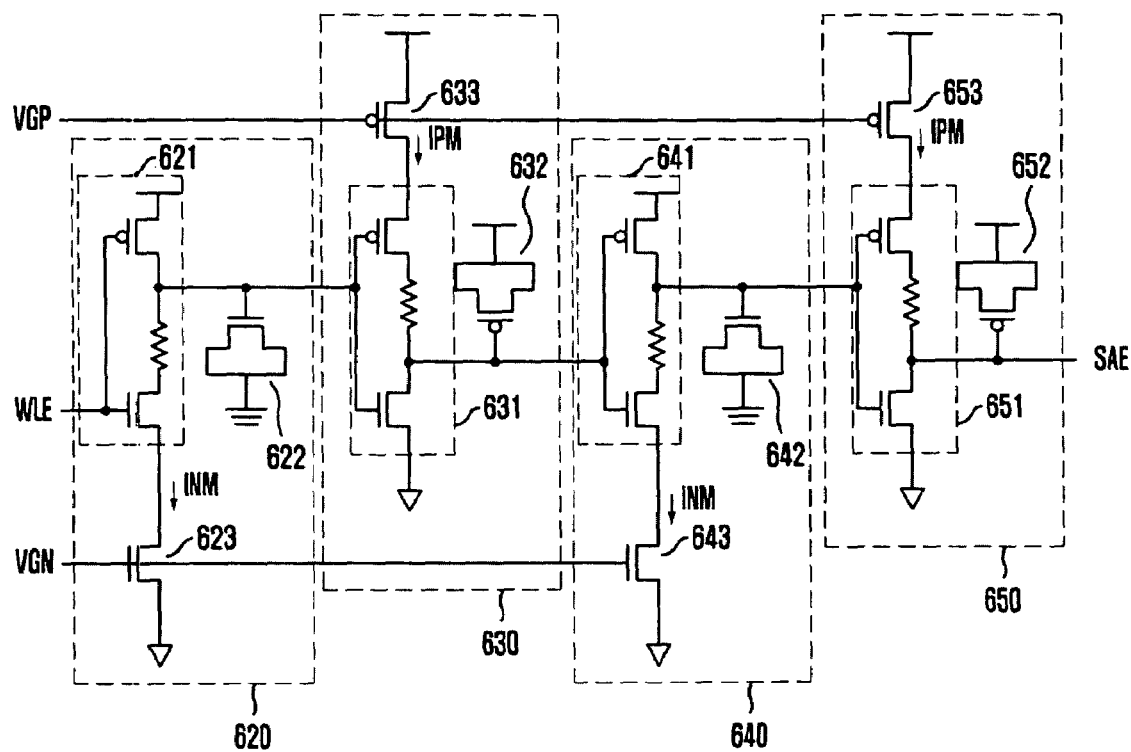

FIG. 6 is a circuit diagram of a delay circuit according to one embodiment of the invention.

The delay circuit of the invention uses a constant current source 610 to maintain a predetermined delay value and is configured to include at least one or more of delay circuits 620, 630, 640 and 650.

The constant current source 610 generates a constant current IREF. The constant current source 610 may be included in a delay circuit, or may be disposed outside the delay circuit. The delay circuit of the invention may be applied to a variety of integrated circuits (ICs). If the constant current source 610 is already provided in the IC to which the delay circuit is applied, the constant current source 610 is used to generate a constant current IREF. In a case of a semiconductor memory device, the constant current source 610 is included in a bandgap circuit of the semiconductor memory device, and the delay circuit of the invention uses the constant current source 610.

As illustrated in FIG. 6, a pair of transistors 611 and 612 for forming a current mirror is disposed below the constant current source 610. Because the pair of transistors 611 and 612 forms a current mirror, a current flowing through a drain-source of the transistor 611 becomes identical to a current flowing through a drain-source of a transistor 612. That is, once the constant current IREF flows through the transistor 611, it flows through the transistor 612. That is, because the drain-source of the transistor 611 has the same current as the drain-source of the transistor 612, the constant current IREF flows through the transistor 613.

The delay units 620, 630, 640 and 650 constituting a delay circuit include logic gates 621, 631, 641 and 651, capacitors 622, 632, 642 and 652, and mirroring units 623, 633, 643 and 653. An input signal WLE passes through the logic gates 621, 631, 641 and 651. The capacitors 622, 632, 642 and 652 are charged and discharged at output terminals of the logic gates 621, 631, 641 and 651 and delay the input signal WLE. The mirroring units 623, 633, 643 and 653 are used for mirroring the constant current IREF in order to maintain constant a current in the logic gates 621, 631, 641 and 651.

Inverters may be exemplarily used as the logic gates 621, 631, 641 and 651 through which an input signal passes, but instead of the inverters, other logic gates such as an NAND gate or a NOR gate can be used as the logic gates 621, 631, 641 and 651. If the NAND gate is used instead of the inverter, one side input of the NAND gate is fixed with VDD and if the NOR gate is used instead of the inverter, one side input of the NOR gate is fixed with VSS. Although the input signal WLE may be delayed by the logic gates 621, 631, 641 and 651 in the delay units 620 to 650, the input signal WLE may be delayed by charging and discharging of the capacitors 622, 632, 642 and 652.

The capacitors 622, 632, 642 and 652 disposed at terminals of the logic gates 621, 631, 641 and 651 are charged and discharged by a current flowing through the output terminals of the logic gates 621, 631, 641 and 651, and also make a time for shifting signals of the output terminal of the logic gates 621, 631, 641 and 651 longer. Accordingly, if the input signal WLE passes through the logic gates 621, 631, 641 and 651 and the capacitors 622, 632, 642 and 652, it is delayed.

The mirroring units 623, 633, 643 and 653 adjust current flowing through the logic gates 621, 631, 641 and 651 to be constant by mirroring a current of the constant current source 610. The mirroring units 623, 633, 643 and 653 have two types. The first type mirroring units 623 and 643 adjust an amount of a current flowing through the logic gates 621 and 641 by controlling a current draining from the logic gates 621 and 641 toward a ground. The second type mirroring units 633 and 653 adjust an amount of a current flowing through the logic gates 631 and 651 by controlling a current flowing toward the logic gates 631 and 651.

The first type mirroring units 623 and 643 are used to constantly maintain a speed of shifting signals of the output terminals of the logic gates 621 to 641 from a high level to a low level because they maintain constant a draining current. The second type mirroring units 633 and 653 are used to constantly maintain a speed of shifting signals of the output terminals of the logic gates 631 and 651 from a low level to a high level because they maintain constant an inflowing current.

The mirroring units 623, 633, 643 and 653 may include transistors that transmit a current proportional to a current of the constant current source 610 through its drain-source transmission line. If the pull-down transistors 623 and 643 have the same size as the transistor 612, the same current like the constant current IREF flows through the pull-down transistors 623 and 643. If the pull-down transistors 623 and 643 have a half width of the transistor 612, a current of ½*IREF flows through the pull-down transistors 623 and 643.

Likewise, if pull-up transistors 633 and 653 have the same size as the transistor 613, the same current like the constant current IREF flows through the pull-up transistors 633 and 653. If the pull-up transistors 633 and 653 have a half width of the transistor 613, a current of ½*IREF flows through the pull-up transistors 633 and 653.

That is, a current proportional to a constant current IREF flows through the mirroring units 623, 633, 643 and 653. Because the constant current IREF is continuously constant, a current flowing through a transistor also can be maintained with a predetermined value.

Because a current flowing through the mirroring units 623, 633, 643 and 653 determines a current flowing through the logic gates 621, 631, 641 and 651, a predetermined current continuously flows through the logic gates 621, 631, 641 and 651. Once a predetermined current flows through the logic gates 621, 631, 641 and 651, a current flowing through the output terminals of the logic gates 621, 631, 641 and 651 becomes constant. Because the capacitors 622, 632, 642 and 652 are charged and discharged by a current that flows through the output terminals of the logic gates 621, 631, 641 and 651, the capacitors 622, 632, 642 and 652 are continuously charged and discharged at a predetermined speed.

The word line enable signal WLE, as illustrated as an example of an input signal, is disabled to a low level and then enabled to a high level. Accordingly, the delay units are arranged in order of 620, 630, 640 and 650. The delay units 620 and 640 maintain a predetermined speed for shifting from a low level to a high level with respect to its input signal, and the delay units 630 and 650 maintain a predetermined speed for shifting from a high level to a low level with respect to its input signal.

If an input signal, (e.g., the word line enable signal WLE) of the delay circuit is a signal that is disabled to a high level and then enabled to a low level (i.e., a timing for shifting from a high level to a low level in a signal is important), the delay units are necessarily arranged in order of 630, 620, 650 and 640.

Figure 1:
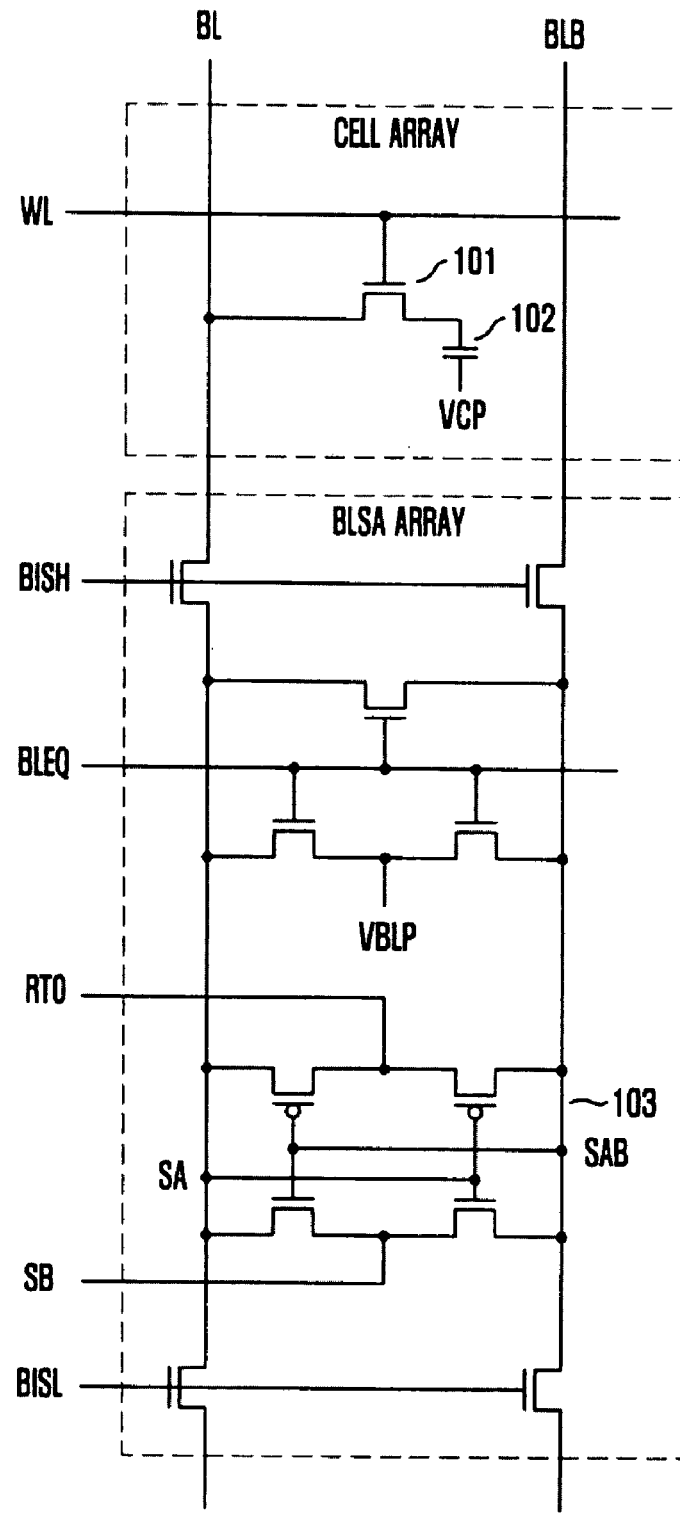
FIG. 1 is a circuit diagram illustrating a core region of a conventional semiconductor memory device.
Figure 2:
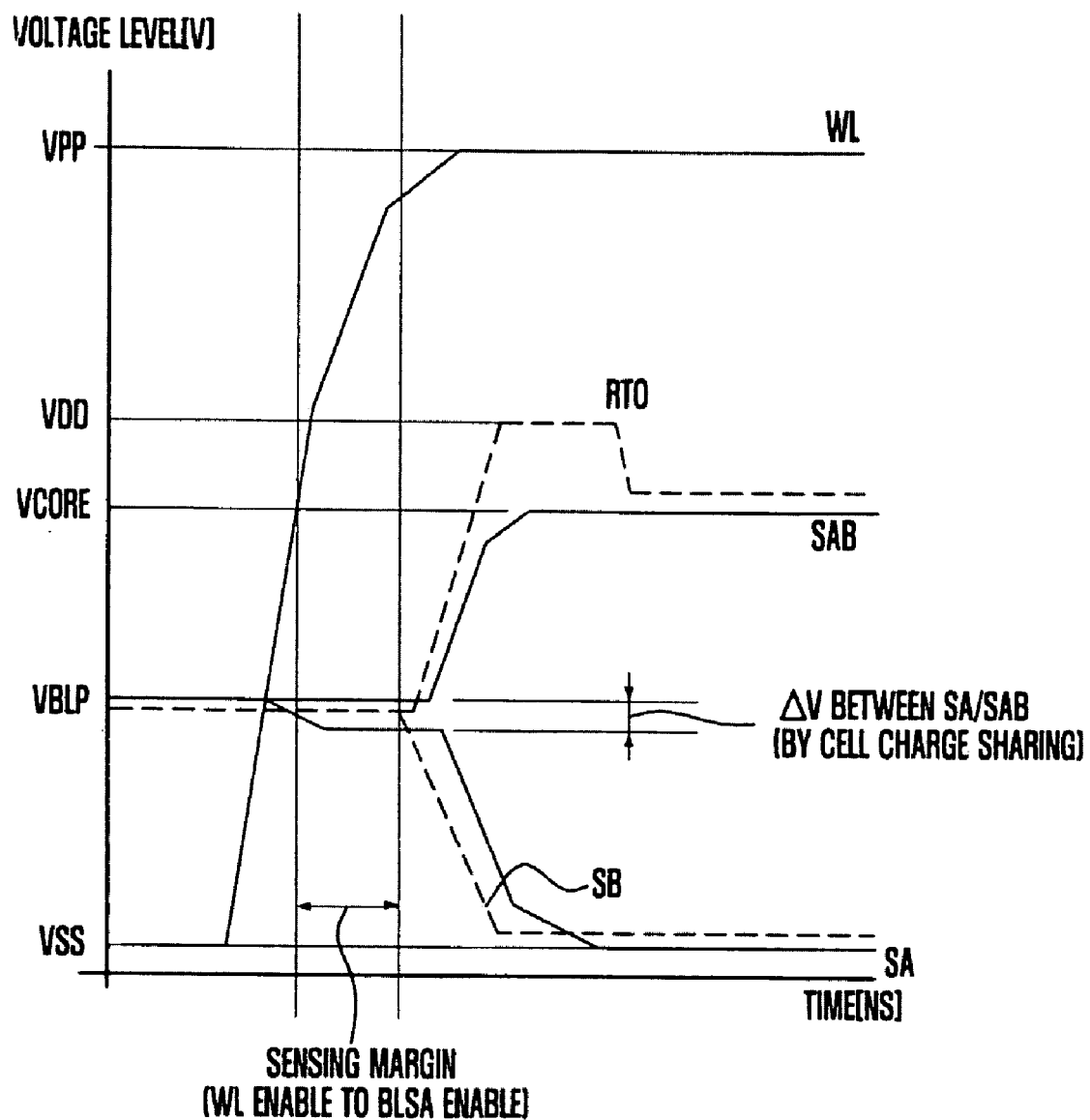
FIG. 2 is a timing diagram illustrating an operation of a core region of a semiconductor device.
Figure 3:
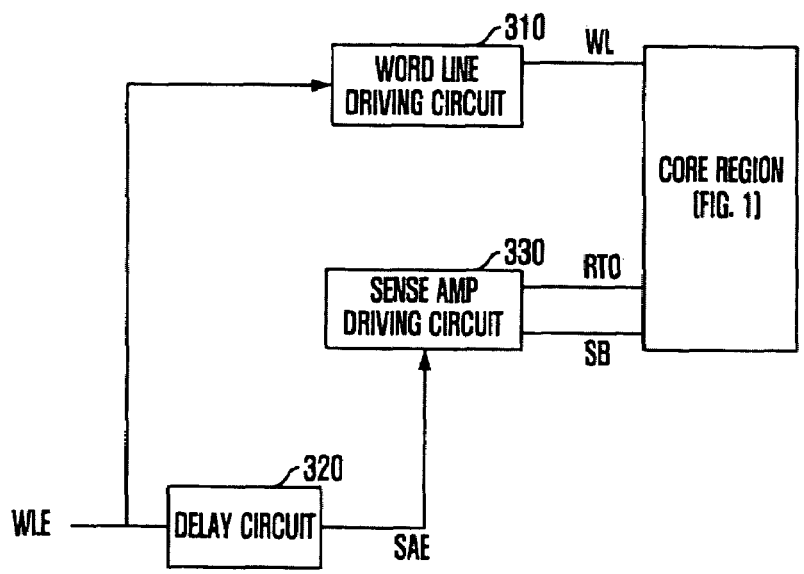
FIG. 3 is a view illustrating a part for driving a word line and a sense amp in a conventional semiconductor memory device.

If the above-mentioned delay circuit is applied to a semiconductor memory device (e.g., 340 of FIG. 3), a time from an enable point of a word line to an enable point of a sense amp can be constantly maintained.

Figure 4:
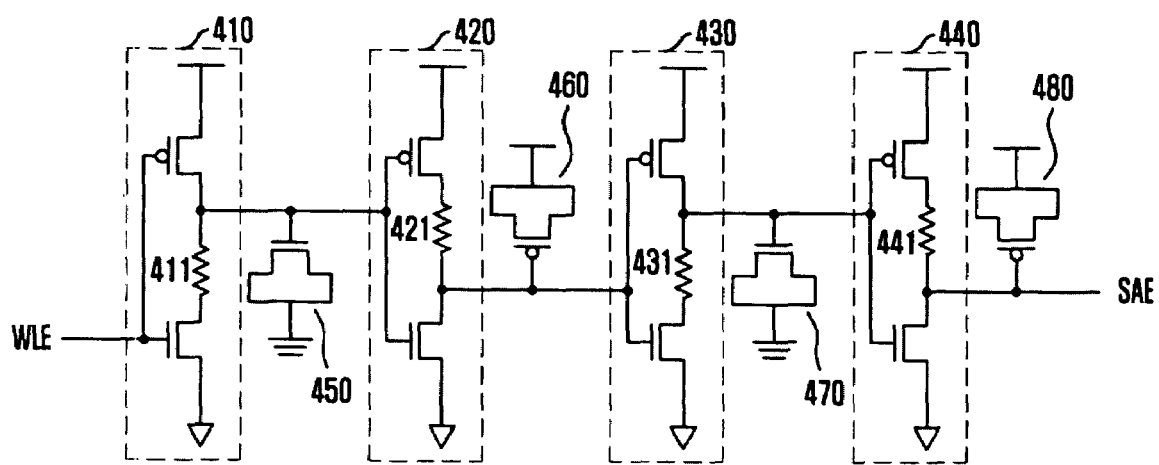
FIG. 4 is a circuit diagram illustrating a detail structure of the delay circuit 320 of FIG. 3.
Figure 5:
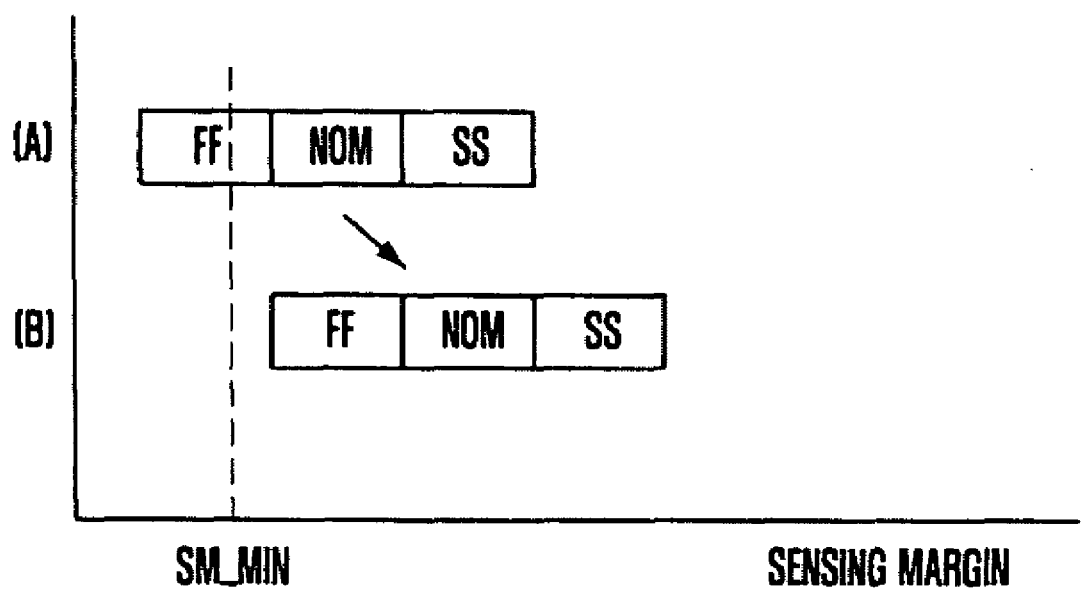
FIG. 5 is a view illustrating a change of a sensing margin according to a design of the delay circuit 320.

That is, even if a fabrication process is altered or a power supply voltage VDD is changed, the sensing margin can be constantly maintained at a desired level. Accordingly, if a delay value of a delay circuit is configured to be slightly greater than a time of the minimum sensing margin SM_MIN of FIG. 4, it can reliably guarantee stable operation and reduce time required for a read operation of a memory device.

Figure 7:
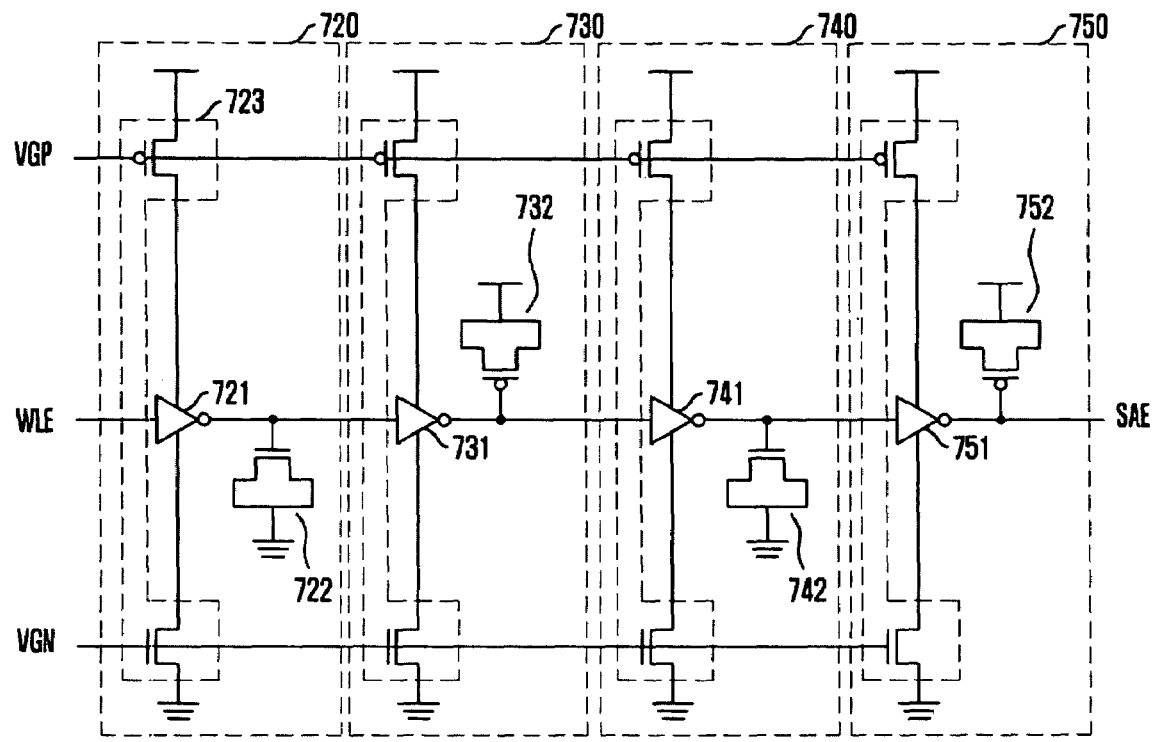
FIG. 7 is a circuit diagram of a delay circuit according to another embodiment of the invention.

FIG. 7 is a circuit diagram of a delay circuit according to another embodiment of the invention.

Like the delay circuit of FIG. 6, the delay circuit of FIG. 7 uses a constant current source 710 in order to maintain a predetermined delay value, and includes at least one or more of delay units 720, 730, 740 and 750.

Additionally, the delay units 720, 730, 740 and 750 includes logic gates 721, 731, 741 and 751, capacitors 722, 732, 742 and 752, and mirroring units 723, 733, 743 and 753. An input signal WLE passes through the logic gates 721, 731, 741 and 751. The capacitors 722, 732, 742 and 752 are charged or discharged at output terminals of the logic gates 721, 731, 741 and 751. The mirroring units 723, 733, 743 and 753 are used for mirroring the constant current IREF in order to maintain a constant current in the logic gates 721, 731, 741 and 751.

However, unlike FIG. 6, the mirroring units 723, 733, 743 and 753 include a pull-up transistor and a pull-down transistor. Accordingly, a current flowing into the logic gates 721, 731, 741 and 751 and a current draining from the logic gates 721, 731, 741 and 751 can be maintained at a constant level.

This means that a delay time for shifting an input signal WLE from a low level to a high level and a delay time for shifting an input signal WLE from a high level to a low level can be maintained at a constant level through one delay circuit.

This delay circuit is effective to delay a signal (where both of a timing for shifting from a high level to a low level and a timing for shifting from a low level to a high level are important) with a predetermined delay value.

The delay circuit of the invention constantly adjusts a current flowing through a capacitor that is charged and discharged and delays an input signal, in order to maintain a predetermined delay value even when conditions are altered.

When the delay circuit is used for adjusting the sensing margin of a semiconductor memory device, a read operation can be performed rapidly with the minimum sensing margin.

While the invention has been described with respect to the specific embodiments, it will be apparent to those skilled in the art that various changes and modifications may be made without departing from the spirit and scope of the invention as defined in the following claims.

What is claimed is:

1. A delay circuit comprising:
   a plurality of logic gates through which an input signal passes;
   a plurality of capacitors, each configured to be charged and discharged at an output terminal of each of the logic gates to delay the input signal; and
   a plurality of mirroring units, each configured to constantly maintain current output by each of the logic gates by mirroring constant current output by a constant current source,
   wherein the mirroring units include first type mirroring units and second type mirroring units alternately coupled to the logic gates, each of the first type mirroring units adjusts an amount of a current flowing through a corresponding logic gate by controlling a current drained from the corresponding logic gate to a ground, and each of the second type mirroring units adjusts an amount of a current flowing through a corresponding logic gate by controlling a current flowing to the logic gate.

2. The delay circuit as recited in claim 1, wherein each of the second type mirroring units includes a pull-up transistor that supplies the corresponding logic gate with a current proportional to the current output by the constant current source.

3. The delay circuit as recited in claim 1, wherein each of the first type mirroring units includes a pull-down transistor that drains, from the corresponding logic gate into a ground terminal, a current proportional to the current output by the constant current source.

4. The delay circuit as recited in claim 1, wherein each of the second type mirroring units includes a pull-up transistor configured to supply the corresponding logic gate with a current proportional to the current output by the constant current source, and each of the first type mirroring units includes a pull-down transistor configured to drain, into a ground terminal from the corresponding logic gate, a current proportional to the current output by the constant current source.

5. A semiconductor memory device, comprising:
   a constant current source configured to generate a constant current; and
   a delay circuit configured to output a sense amp enable signal by delaying a word line enable signal,
   wherein the delay circuit includes:
   a plurality of logic gates through which the word line input signal passes;
   a plurality of capacitors, each configured to be charged and discharged at an output terminal of a respective one of the logic gates to delay the word line input signal; and
   a plurality of mirroring units, each configured to constantly maintain current of a respective one of the logic gates by mirroring the constant current output by the constant current source,
   wherein the mirroring units include first type mirroring units and second type mirroring units alternately coupled to the logic gates, each of the first type mirroring units adjusts an amount of a current flowing through a corresponding logic gate by controlling a current drained from the corresponding logic gate to a ground, and each of the second type mirroring units adjusts an amount of a current flowing through a corresponding logic gate by controlling a current flowing to the logic gate.

6. The semiconductor memory device as recited in claim 5, wherein each of the second type mirroring units includes a pull-up transistor that supplies the corresponding logic gate with a current proportional to the constant current.

7. The semiconductor memory device as recited in claim 5, wherein each of the first type mirroring units includes a pull-down transistor that drains, from the logic gate into a ground terminal, a current proportional to the constant current.

8. The semiconductor memory device as recited in claim 5, wherein each of the second type mirroring units includes a pull-up transistor configured to supply to the logic gate a current proportional to the constant current, and each of the first type mirroring units includes a pull-down transistor configured to drain from the logic gate into a ground terminal a current proportional to the constant current.

* * * * *